US009947605B2

(12) United States Patent
Sirinorakul et al.

(10) Patent No.: US 9,947,605 B2
(45) Date of Patent: Apr. 17, 2018

(54) FLIP CHIP CAVITY PACKAGE

(75) Inventors: Saravuth Sirinorakul, Bangkok (TH); Somchai Nondhasitthichai, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 408 days.

(21) Appl. No.: 12/914,694

(22) Filed: Oct. 28, 2010

(65) Prior Publication Data

US 2011/0039371 A1    Feb. 17, 2011

Related U.S. Application Data

(62) Division of application No. 12/231,710, filed on Sep. 4, 2008, now Pat. No. 9,761,435.

(51) Int. Cl.
*H01L 21/00*    (2006.01)
*H01L 23/31*    (2006.01)
(Continued)

(52) U.S. Cl.
CPC ........ *H01L 23/3107* (2013.01); *H01L 21/561* (2013.01); *H01L 21/6835* (2013.01); *H01L 23/49861* (2013.01); *H01L 24/97* (2013.01); *H01L 24/16* (2013.01); *H01L 24/48* (2013.01); *H01L 24/81* (2013.01); *H01L 24/85* (2013.01);
(Continued)

(58) Field of Classification Search
CPC .................................................. H01L 23/3107
See application file for complete search history.

(56) References Cited

U.S. PATENT DOCUMENTS 3,611,061 A    10/1971 Segerson .................. 317/234 R
4,411,719 A    10/1983 Lindberg ........................ 156/64
(Continued)

OTHER PUBLICATIONS

Quirk, Michael, and Julian Serda. Semiconductor Manufacturing Technology. Upper Saddle River, NJ: Prentice Hall, 2001.*
(Continued)

*Primary Examiner* — Mark Tornow
(74) *Attorney, Agent, or Firm* — Haverstock & Owens LLP

(57) ABSTRACT

A process for forming a semiconductor package. The process comprises forming a first leadframe strip mounted upon an adhesive tape. The first leadframe strip is at least partially encased in a first mold compound thereby forming a molded leadframe strip. At least one flip chip semiconductor device is mounted on the molded leadframe strip. The semiconductor device has conductive masses attached thereon to effectuate electrical contact between the semiconductor device and the molded leadframe. The conductive masses can be substantially spherical or cylindrical. Liquid encapsulant is dispensed on the semiconductor device to encapsulate the flip chip semiconductor device. A cavity is formed between the semiconductor device and the molded leadframe. The molded leadframe strip, the semiconductor device, and the conductive masses are at least partially encased in a second mold compound. The second mold compound can be molded so that a surface of the flip chip semiconductor device that is not attached to the molded leadframe is substantially exposed or molded to produce a globular form on the flip chip semiconductor device. The molded leadframe strip is singulated to form discrete semiconductor packages.

20 Claims, 13 Drawing Sheets

(51) Int. Cl.
  *H01L 21/56*    (2006.01)
  *H01L 21/683*   (2006.01)
  *H01L 23/498*   (2006.01)
  *H01L 23/00*    (2006.01)

(52) U.S. Cl.
  CPC ........... *H01L 2221/68345* (2013.01); *H01L 2224/16245* (2013.01); *H01L 2224/32245* (2013.01); *H01L 2224/48091* (2013.01); *H01L 2224/48247* (2013.01); *H01L 2224/73265* (2013.01); *H01L 2224/85* (2013.01); *H01L 2224/97* (2013.01); *H01L 2924/00014* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/12041* (2013.01); *H01L 2924/14* (2013.01); *H01L 2924/181* (2013.01)

(56) References Cited

U.S. PATENT DOCUMENTS

| | | | |
|---|---|---|---|
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,105,259 A | 4/1992 | McShane et al. | |
| 5,195,023 A | 3/1993 | Manzione et al. | |
| 5,247,248 A | 9/1993 | Fukunaga | 324/158 |
| 5,248,075 A | 9/1993 | Young et al. | 228/5.1 |
| 5,281,851 A | 1/1994 | Mills et al. | |
| 5,292,688 A * | 3/1994 | Hsiao | H01L 21/563 257/E21.503 |
| 5,343,076 A | 8/1994 | Katayama et al. | |
| 5,396,185 A | 3/1995 | Honma et al. | 324/754 |
| 5,397,921 A | 3/1995 | Karnezos | 257/779 |
| 5,479,105 A | 12/1995 | Kim et al. | 324/755 |
| 5,535,101 A * | 7/1996 | Miles et al. | 361/801 |
| 5,596,231 A | 1/1997 | Combs | 257/776 |
| 5,843,808 A | 12/1998 | Karnezos | 438/121 |
| 5,959,363 A * | 9/1999 | Yamada | H01L 21/563 257/737 |
| 5,990,692 A | 11/1999 | Jeong et al. | 324/755 |
| 6,033,933 A | 3/2000 | Hur | |
| 6,072,239 A | 6/2000 | Yoneda et al. | 257/730 |
| 6,111,324 A | 8/2000 | Sheppard et al. | 257/787 |
| 6,159,770 A | 12/2000 | Tetaka et al. | 438/112 |
| 6,177,729 B1 | 1/2001 | Benenati et al. | |
| 6,197,615 B1 | 3/2001 | Song et al. | |
| 6,208,020 B1 | 3/2001 | Minamio et al. | |
| 6,229,200 B1 | 5/2001 | Mclellan et al. | 257/666 |
| 6,242,281 B1 | 6/2001 | Mclellan et al. | 438/106 |
| 6,250,841 B1 | 6/2001 | Ledingham | |
| 6,284,569 B1 | 9/2001 | Sheppard et al. | 438/110 |
| 6,285,075 B1 | 9/2001 | Combs et al. | 257/675 |
| 6,294,100 B1 | 9/2001 | Fan et al. | 216/14 |
| 6,304,000 B1 | 10/2001 | Isshiki et al. | 257/782 |
| 6,326,678 B1 | 12/2001 | Karnezos et al. | 257/666 |
| 6,329,711 B1 | 12/2001 | Kawahara et al. | 257/698 |
| 6,353,263 B1 | 3/2002 | Dotta et al. | 257/777 |
| 6,372,625 B1 | 4/2002 | Shigeno et al. | |
| 6,376,921 B1 | 4/2002 | Yoneda et al. | 257/787 |
| 6,384,472 B1 | 5/2002 | Huang | |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | 438/108 |
| 6,448,665 B1 * | 9/2002 | Nakazawa | B29C 45/34 257/737 |
| 6,451,709 B1 | 9/2002 | Hembree | 438/759 |
| 6,455,348 B1 | 9/2002 | Yamaguchi | 438/106 |
| 6,476,469 B2 | 11/2002 | Hung et al. | |
| 6,489,218 B1 | 12/2002 | Kim et al. | 438/460 |
| 6,498,099 B1 | 12/2002 | McLellan et al. | 438/689 |
| 6,507,116 B1 | 1/2003 | Caletka et al. | 257/778 |
| 6,545,332 B2 | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,661,104 B2 | 12/2003 | Jiang | |
| 6,667,191 B1 | 12/2003 | McLellan et al. | 438/121 |
| 6,683,368 B1 | 1/2004 | Mostafazadeh | |
| 6,686,667 B2 | 2/2004 | Chen et al. | 257/787 |
| 6,703,696 B2 | 3/2004 | Ikenaga et al. | 257/678 |
| 6,723,585 B1 | 4/2004 | Tu et al. | |
| 6,724,071 B2 | 4/2004 | Combs | 257/666 |
| 6,734,044 B1 | 5/2004 | Fan et al. | 438/123 |
| 6,734,552 B2 | 5/2004 | Combs et al. | 257/707 |
| 6,737,755 B1 | 5/2004 | McLellan et al. | 257/796 |
| 6,764,880 B2 | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 * | 11/2004 | Islam et al. | 257/666 |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/666 |
| 6,893,169 B1 | 5/2005 | Exposito et al. | |
| 6,894,376 B1 | 5/2005 | Mostafazadeh et al. | |
| 6,897,428 B2 | 5/2005 | Minamio et al. | 250/208.1 |
| 6,927,483 B1 | 8/2005 | Lee et al. | |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,045,883 B1 | 5/2006 | McCann et al. | |
| 7,049,177 B1 | 5/2006 | Fan et al. | 438/123 |
| 7,052,935 B2 | 5/2006 | Pai et al. | |
| 7,060,535 B1 | 6/2006 | Sirinorakul et al. | 438/123 |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,125,747 B2 | 10/2006 | Lee et al. | |
| 7,126,218 B1 | 10/2006 | Darveaux et al. | |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,253,503 B1 | 8/2007 | Fusaro et al. | |
| 7,259,678 B2 | 8/2007 | Brown et al. | |
| 7,274,088 B2 | 9/2007 | Wu et al. | 257/673 |
| 7,314,820 B2 | 1/2008 | Lin et al. | 438/617 |
| 7,315,077 B2 | 1/2008 | Choi et al. | |
| 7,315,080 B1 | 1/2008 | Fan et al. | 257/717 |
| 7,342,305 B1 | 3/2008 | Diao et al. | 257/706 |
| 7,344,920 B1 | 3/2008 | Kirloskar et al. | 438/123 |
| 7,348,663 B1 | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 * | 7/2008 | Shim et al. | 438/106 |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,459,345 B2 | 12/2008 | Hwan | |

(56) References Cited

U.S. PATENT DOCUMENTS

| | | | |
|---|---|---|---|
| 7,476,975 B2* | 1/2009 | Ogata | H01L 21/563 257/778 |
| 7,482,690 B1 | 1/2009 | Fan et al. | 257/724 |
| 7,495,319 B2 | 2/2009 | Fukuda et al. | |
| 7,507,603 B1 | 3/2009 | Berry et al. | |
| 7,595,225 B1 | 9/2009 | Fan et al. | 438/112 |
| 7,608,484 B2 | 10/2009 | Lange et al. | |
| 7,709,857 B2 | 5/2010 | Kim et al. | |
| 7,714,418 B2 | 5/2010 | Lim et al. | 257/670 |
| 8,035,207 B2 | 10/2011 | Camacho et al. | |
| 8,710,651 B2* | 4/2014 | Sakata | H01L 21/563 257/737 |
| 2001/0005047 A1 | 6/2001 | Jimarez et al. | |
| 2001/0007285 A1 | 7/2001 | Yamada et al. | |
| 2002/0090162 A1* | 7/2002 | Asada | H01L 24/83 385/14 |
| 2002/0109214 A1 | 8/2002 | Minamio et al. | |
| 2003/0006055 A1 | 1/2003 | Chien-Hung et al. | |
| 2003/0045032 A1 | 3/2003 | Abe | 438/123 |
| 2003/0071333 A1 | 4/2003 | Matsuzawa | 257/676 |
| 2003/0102540 A1 | 6/2003 | Lee | |
| 2003/0143776 A1 | 7/2003 | Pedrron, Jr. et al. | 438/106 |
| 2003/0178719 A1 | 9/2003 | Combs et al. | 257/704 |
| 2003/0201520 A1* | 10/2003 | Knapp et al. | 257/666 |
| 2003/0207498 A1 | 11/2003 | Islam et al. | 438/120 |
| 2003/0234454 A1 | 12/2003 | Pedron et al. | |
| 2004/0014257 A1 | 1/2004 | Kim et al. | 438/111 |
| 2004/0046237 A1 | 3/2004 | Abe et al. | 257/676 |
| 2004/0046241 A1 | 3/2004 | Combs et al. | |
| 2004/0070055 A1 | 4/2004 | Punzalan et al. | |
| 2004/0080025 A1 | 4/2004 | Kasahara et al. | 257/666 |
| 2004/0110319 A1 | 6/2004 | Fukutomi et al. | 438/106 |
| 2004/0226773 A1 | 11/2004 | Koon et al. | |
| 2005/0003586 A1 | 1/2005 | Shimanuki et al. | 438/124 |
| 2005/0077613 A1 | 4/2005 | McLellan et al. | 257/706 |
| 2005/0184404 A1 | 8/2005 | Huang et al. | |
| 2005/0236701 A1 | 10/2005 | Minamio et al. | |
| 2005/0263864 A1 | 12/2005 | Islam et al. | |
| 2006/0071351 A1 | 4/2006 | Lange | |
| 2006/0170081 A1 | 8/2006 | Gerber et al. | |
| 2006/0192295 A1 | 8/2006 | Lee et al. | 257/778 |
| 2006/0223229 A1 | 10/2006 | Kirloskar et al. | 438/106 |
| 2006/0223237 A1 | 10/2006 | Combs et al. | 438/122 |
| 2006/0237231 A1 | 10/2006 | Hata et al. | |
| 2006/0273433 A1 | 12/2006 | Itou et al. | 257/666 |
| 2007/0001278 A1* | 1/2007 | Jeon et al. | 257/676 |
| 2007/0013038 A1 | 1/2007 | Yang | |
| 2007/0029540 A1 | 2/2007 | Kajiwara et al. | |
| 2007/0093000 A1 | 4/2007 | Shim et al. | |
| 2007/0200210 A1 | 8/2007 | Zhao et al. | 257/676 |
| 2007/0235217 A1 | 10/2007 | Workman | 174/260 |
| 2008/0048308 A1 | 2/2008 | Lam | 257/686 |
| 2008/0150094 A1 | 6/2008 | Anderson | 257/659 |
| 2008/0251913 A1* | 10/2008 | Inomata | H01L 21/563 257/737 |
| 2009/0014848 A1 | 1/2009 | Ong Wai Lian et al. | |
| 2009/0152691 A1 | 6/2009 | Nguyen et al. | |
| 2009/0152694 A1 | 6/2009 | Bemmerl et al. | |
| 2009/0230525 A1 | 9/2009 | Chang Chien et al. | |
| 2009/0236713 A1 | 9/2009 | Xu et al. | |
| 2010/0133565 A1 | 6/2010 | Cho et al. | |
| 2010/0149773 A1 | 6/2010 | Said | |
| 2010/0178734 A1 | 7/2010 | Lin | |
| 2010/0224971 A1 | 9/2010 | Li | |
| 2010/0327432 A1 | 12/2010 | Sirinorakul | |
| 2011/0115061 A1 | 5/2011 | Krishnan et al. | |
| 2011/0201159 A1 | 8/2011 | Mori et al. | |
| 2013/0069221 A1 | 3/2013 | Lee et al. | |

OTHER PUBLICATIONS

Office Action dated Apr. 25, 2012, U.S. Appl. No. 12/960,268, filed Dec. 3, 2010, Somchai Nondhasitthichai et al.
Office Action dated May 7, 2012, U.S. Appl. No. 12/576,846, filed Oct. 9, 2009, Somchai Nondhasitthichai et al.
Office Action dated Aug. 3, 2011, U.S. Appl. No. 12/002,187, filed Dec. 14, 2007, Somchai Nondhasitthichai et al.
Office Action dated Dec. 6, 2010, U.S. Appl. No. 12/231,710, filed Sep. 4, 2008, Saravuth Sirinorakul et al.
Non-Final Office Action dated Dec. 20, 2012, U.S. Appl. No. 13/045,253, filed Mar. 10, 2011, Saravuth Sirinorakul.
Office Action dated Dec. 5, 2011, U.S. Appl. No. 12/576,846, filed Oct. 9, 2009, Somchai Nondhasitthichai et al.
Office Action dated Feb. 10, 2011, U.S. Appl. No. 12/002,187, filed Dec. 14, 2007, Somchai Nondhasitthichai et al.
Office Action dated May 11, 2010, U.S. Appl. No. 12/002,054, filed Dec. 14, 2007, Somchai Nondhasitthichai et al.
Notice of Allowance, dated Nov. 28, 2012, U.S. Appl. No. 12/960,268, filed Dec. 3, 2012, Saravuth Sirinorakul et al.
Michael Quirk and Julian Serda, Semiconductor Manufacturing Technology, Pearson Education International, Pearson Prentice Hall, 2001, p. 587-588.
Office Action dated Dec. 19, 2012, U.S. Appl. No. 12/834,688, filed Jul. 12, 2010, Saravuth Sirinorakul.
Office Action dated Jan. 15, 2014, U.S. Appl. No. 12/002,187, filed Dec. 14, 2007, Somchai Nondhasitthichai et al.
Non-Final Office Action dated Dec. 30, 2014, U.S. Appl. No. 13/886,888, filed May 3, 2013, Somchai Nondhasitthichai.
Office Action dated Nov. 2, 2015, U.S. Appl. No. 12/834,688, filed Jul. 12, 2010, Saravuth Sirinorakul, 17 pages.
Office Action dated Dec. 9, 2015, U.S. Appl. No. 12/002,054, filed Dec. 14, 2007, Somchai Nondhasitthichai et al., 25 pages.
Office Action from the U.S. Patent Office, U.S. Appl. No. 12/231,710, filed Sep. 4, 2008, First Named Inventor: Saravuth Sirinorakul, dated Sep. 4, 2015, pp. 30.
Office Action from the U.S. Patent Office, U.S. Appl. No. 12/002,054, filed Dec. 14, 2007, First Named Inventor: Somchai Nondhasitthichai, dated Aug. 19, 2015, pp. 17.
Notice of Allowance from the U.S. Patent Office, U.S. Appl. No. 12/378,119, filed Feb. 10, 2009, First Named Inventor: Somchai Nondhasitthichai, dated Jul. 23, 2015, pp. 7.
Final Office Action dated Dec. 21, 2016, U.S. Appl. No. 12/231,710, filed Sep. 4, 2008, Saravuth Sirinorakul, 35 pages.

* cited by examiner

FLIP CHIP CAVITY PACKAGE

RELATED APPLICATIONS

This application is a Divisional Application of the co-pending application Ser. No. 12/231,710, filed Sep. 4, 2008 and titled FLIP CHIP CAVITY PACKAGE," hereby incorporated in its entirety.

This application is a Continuation-in-part of the co-pending application Ser. No. 12/002,186, filed Dec. 14, 2007, and titled "CAVITY MOLDED LEADFRAME AND METHOD OF MANUFACTURING THE SAME", application Ser. No. 12/002,054, filed Dec. 14, 2007, and titled "MOLDED LEADFRAME AND METHOD OF MANUFACTURING THE SAME" and application Ser. No. 12/002,187, filed Dec. 14, 2007, and titled "HALF ETCH PADDLE MOLDED LEADFRAME AND METHOD OF MANUFACTURING THE SAME", all of which claim priority under 35 U.S.C. section 119(e) to the U.S. Provisional Application Ser. No. 60/875,162, filed Dec. 14, 2006, and titled "MOLDED-LEADFRAME SUBSTRATE SEMICONDUCTOR PACKAGE," and the U.S. Provisional Application Ser. No. 60/877,274, filed Dec. 26, 2006, and titled "MOLDED-LEADFRAME SUBSTRATE SEMICONDUCTOR PACKAGE," all of which are hereby incorporated by reference in their entirety.

FIELD OF THE INVENTION

The present invention is in the field of semiconductor packaging and is more specifically directed to a flip chip cavity package.

BACKGROUND

The increasing demand for computer performance has led to higher chip internal clock frequencies and parallelism, and has increased the need for higher bandwidth and lower latencies. Processor frequencies are predicted to reach 29 GHz by 2018, and off-chip signaling interface speeds are expected to exceed 56 Gb/s. Optimization of bandwidth, power, pin count, or number of wires and cost are the goals for high-speed interconnect design. The electrical performance of interconnects is restricted by noise and timing limitations of the silicon, package, board and cable. To that end, semiconductor packages must be made smaller, conforming more and more closely to the size of the die encapsulated within. However, as the size of the package shrinks to the size of the die itself, the size of the package becomes insufficient to support the number of leads generally required by current applications.

Chip Scale Packages (CSP) have emerged as the dominant package for such applications. FIG. 1 shows an example of a CSP in current practice. More specifically, the package in FIG. 1 is a Wafer Level Chip Scale Package 10 (WLCSP), commonly marketed by companies such as National Semiconductor Corporation as the Micro SMD and Maxim Integrated Products as the UCSP. Generally, solder bumps 11 are formed on processed and completed semiconductor wafers 12 before the wafers are sawed to form an individual semiconductor device 13. Although this has dramatically reduced package size and can be useful in some instances, it suffers from drawbacks which remove it from consideration for certain applications. First, the pitch between the solder bumps 11 must be made wide enough to effectuate assembly of the device onto a printed circuit board in application. This requirement can force manufacturers to artificially grow die sizes to meet the minimum pitch, thereby increasing cost. Second, the total I/O count of the device is generally constrained due to the decreased reliability at the high bump counts. At bump counts higher than 49, or a 7×7 array, reliability becomes critical and applications such as hand held devices, which require a high degree of reliability, no long become a possible marketplace.

To overcome the issues mentioned above, the semiconductor industry has moved toward Ball Grid Array (BGA) packages. The BGA is descended from the pin grid array (PGA), which is a package with one face covered (or partly covered) with pins in a grid pattern. These pins are used to conduct electrical signals from the integrated circuit (IC) to the printed circuit board (PCB) it is placed on. In a BGA, the pins are replaced by balls of solder formed on the bottom of the package. The device is placed on a PCB that carries copper pads in a pattern that matches the solder balls. The assembly is then heated, such as in a reflow oven or by an infrared heater, causing the solder balls to melt. Surface tension causes the molten solder to hold the package in alignment with the circuit board at the correct separation distance while the solder cools and solidifies. The BGA is a solution to the problem of producing a miniature package for an IC with many hundreds of I/O. As pin grid arrays and dual-in-line (DIP) surface mount (SOIC) packages are produced with more and more pins, and with decreasing spacing between the pins, difficulties arose in the soldering process. As package pins got closer together, the danger of accidentally bridging adjacent pins with solder grew. BGAs do not have this problem, because the solder is factory-applied to the package in exactly the right amount. Alternatively, solder balls can be replaced by solder landing pads, forming a Land Grid Array (LGA) package.

FIG. 2 shows a cutaway image of a generic BGA package 20. Generally, an IC 21 has bondpads 22 to which bondwires 23 are affixed. The IC 21 is mounted on a substrate 24. In current practice, the substrate 24 is a laminate, such as polyimide. Generally, the substrate 24 is of a similar construction to a PCB. The substrate 24 has copper patterns 25 formed thereon. The bondwires 23 effectuate electrical contact between the IC 21 and the copper patterns 25. The copper patterns 25 are electrically connected to solder balls 26 through via holes 27 in the substrate 24. In most embodiments of BGA packages, the IC 21 is encapsulated by a mold compound 28. Although BGA packages effectuate large I/O count devices in small areas, they are susceptible to moisture. Generally, moisture seeps into packages while awaiting assembly into a finished product, such as a computer. When the package is heated to solder the device into its end application, moisture trapped within the device turns into vapor and cannot escape quickly enough, causing the package to burst open. This phenomenon is known as the "popcorn" effect. What is needed is a semiconductor package that is robust to both structural stressors and moisture.

SUMMARY OF THE DISCLOSURE

One aspect of the invention is a process for forming a semiconductor package. The process includes forming a first leadframe strip mounted upon an adhesive tape. The first leadframe strip is at least partially encased in a first mold compound thereby forming a molded leadframe strip. At least one flip chip semiconductor device is mounted on the molded leadframe strip in a face to face manner to allow electrical interconnection between each flip chip semiconductor device and its corresponding leadframe. Each flip chip semiconductor device has conductive masses attached thereon to effectuate electrical contact between the at least one flip chip semiconductor device and the corresponding molded leadframe. Preferably, the conductive masses are formed of solder. In one embodiment, the conductive masses are substantially spherical. In another embodiment, the conductive masses are substantially cylindrical. Liquid encapsulant is dispensed on each flip chip semiconductor device to encapsulate the flip chip semiconductor device. A cavity is formed between each flip chip semiconductor device and its molded leadframe. The molded leadframe strip, the at least one flip chip semiconductor device, and the conductive masses are at least partially encased in a second mold compound. In one embodiment, the second mold compound is molded so that a surface of the flip chip semiconductor device that is not attached to the molded leadframe is substantially exposed. In another embodiment, the second mold compound is dispensed to produce a globular form on the at least one flip chip semiconductor device to form the cavity between the at least one flip chip semiconductor device and the at least one molded leadframe. The molded leadframe strip is singulated to form discrete semiconductor packages.

In some embodiments, a second leadframe strip is coupled to the first leadframe strip to form a dual leadframe strip. The first leadframe strip and the second leadframe strip are able to be coupled by a soft metal which is formed of at least one of the following materials: gold, silver, lead, and tin. The first and second mold compounds can be identical or differing materials.

Another aspect of the invention is an apparatus for forming a semiconductor package. The apparatus includes a means for forming a first leadframe strip mounted upon an adhesive tape. Means is provided for at least partially encasing the first leadframe strip in a first mold compound thereby forming a molded leadframe strip. Means is provided for mounting at least one flip chip semiconductor device on the molded leadframe strip so that each flip chip semiconductor device having conductive masses attached thereon to effectuate electrical contact between each flip chip semiconductor device and the corresponding molded leadframe. Preferably, the conductive masses are formed of solder. In one embodiment, the conductive masses are substantially spherical. In another embodiment, the conductive masses are substantially cylindrical. Means is provided for dispensing liquid encapsulant on each flip chip semiconductor device to encapsulate the flip chip semiconductor device. A cavity is formed between each flip chip semiconductor device and its molded leadframe. Means is provided for at least partially encasing the molded leadframe strip, each flip chip semiconductor device, and the conductive masses in a second mold compound. In one embodiment, the second mold compound is molded so that a surface of the flip chip semiconductor device that is not attached to the molded leadframe is substantially exposed. In another embodiment, the second mold compound is dispensed to produce a globular form on the at least one flip chip semiconductor device to form the cavity between each flip chip semiconductor device and its molded leadframe. Means is provided for singulating the molded leadframe strip to faint discrete flip chip semiconductor packages.

In some embodiments, the apparatus includes a means to couple the first leadframe to a second leadframe by a soft metal. The soft metal is formed of at least one of the following materials: gold, silver, lead, and tin. The first and second mold compounds can be identical or differing materials.

Another aspect of the invention is a semiconductor package. The package includes a first leadframe so that the first leadframe is formed with a half etch technique. A substrate supports the first leadframe. The substrate includes a first mold compound. At least one flip chip semiconductor die is mounted on the first leadframe. A plurality of conductive masses effectuate electrical contact between the first leadframe and the corresponding flip chip semiconductor die. Preferably, the conductive masses are formed of solder. In one embodiment, the conductive masses are substantially spherical. In another embodiment, the conductive masses are substantially cylindrical. A second mold compound at least partially encases the first leadframe, each flip chip semiconductor die, and the plurality of conductive masses. In one embodiment, the second mold compound is molded so that a surface of the flip chip semiconductor device that is not attached to the molded leadframe is substantially exposed. In another embodiment, the second mold compound is molded to produce a globular form on each flip chip semiconductor device to form the cavity between each flip chip semiconductor device and its molded leadframe.

Optionally the semiconductor package includes a second leadframe coupled to the first leadframe by a soft metal. The soft metal is formed of at least one of the following materials: gold, silver, lead and tin.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail. For example, it is commonly known in the art of semiconductor device assembly that assembly is generally done on a matrix array of leadframes, often referred to as leadframe strips. Each strip has a plurality of individual positions that will all be processed in the same way through various steps to form individual packaged semiconductor devices. A position can have one or more semiconductor die within.

Additional information on leadframe strips as described in the present invention can be found in the related U.S. patent application Ser. No. 11/788,496 filed Mar. 19, 2007, entitled "MOLDED LEADFRAME SUBSTRATE SEMICONDUCTOR PACKAGE," the entirety of which is hereby incorporated by reference.

Figure 1:
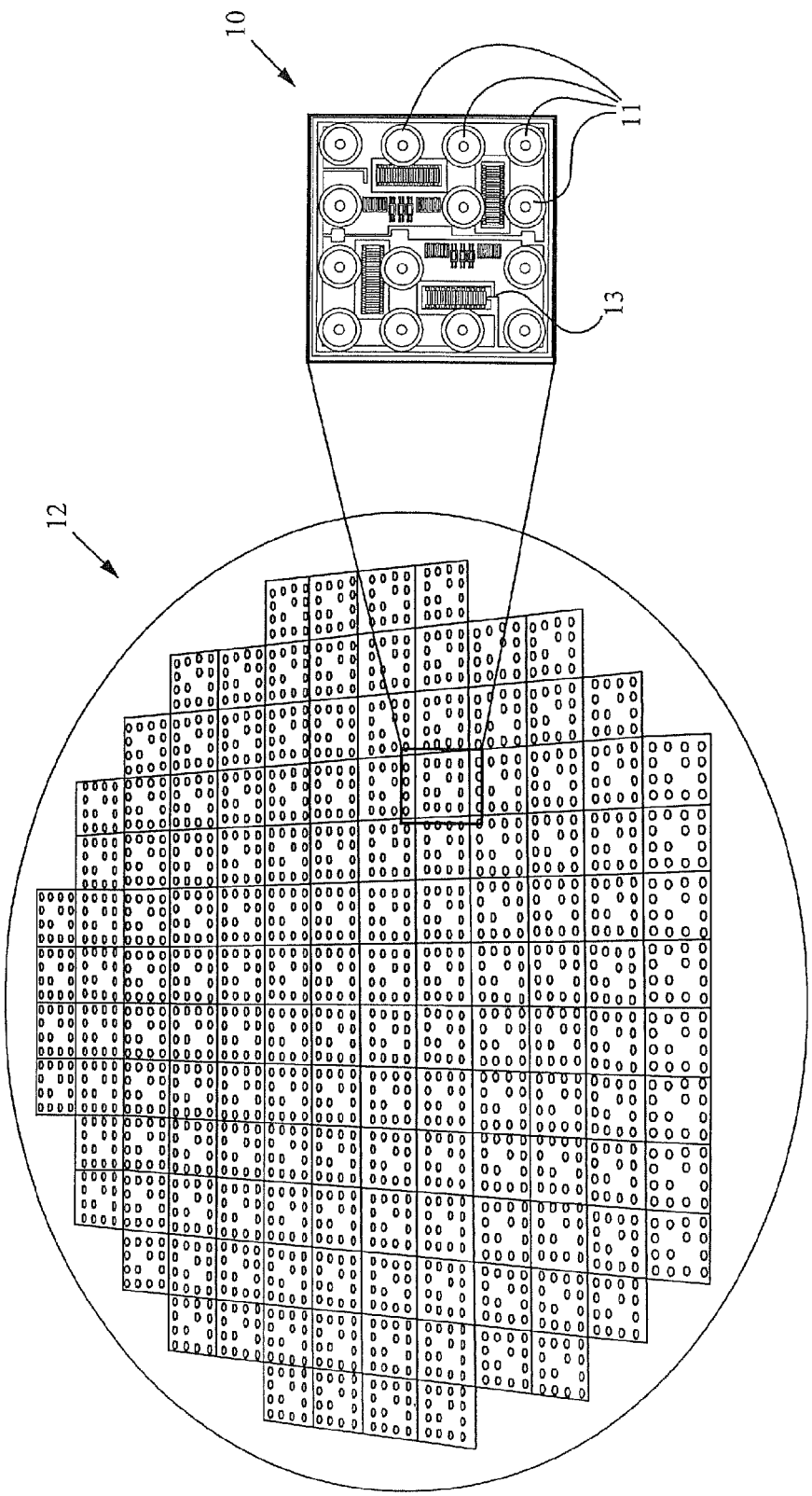
FIG. 1 shows a prior art Chip Scale Package.
Figure 2:
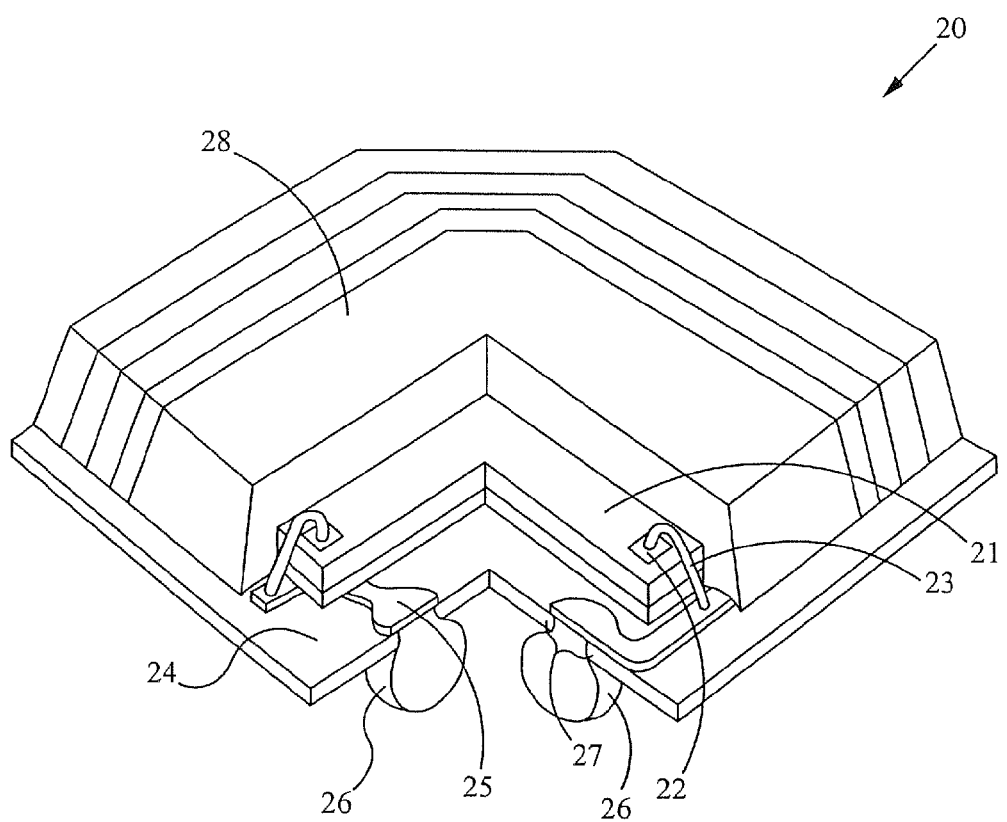
FIG. 2 shows a prior art Ball Grid Array package in cross section.
Figure 3:
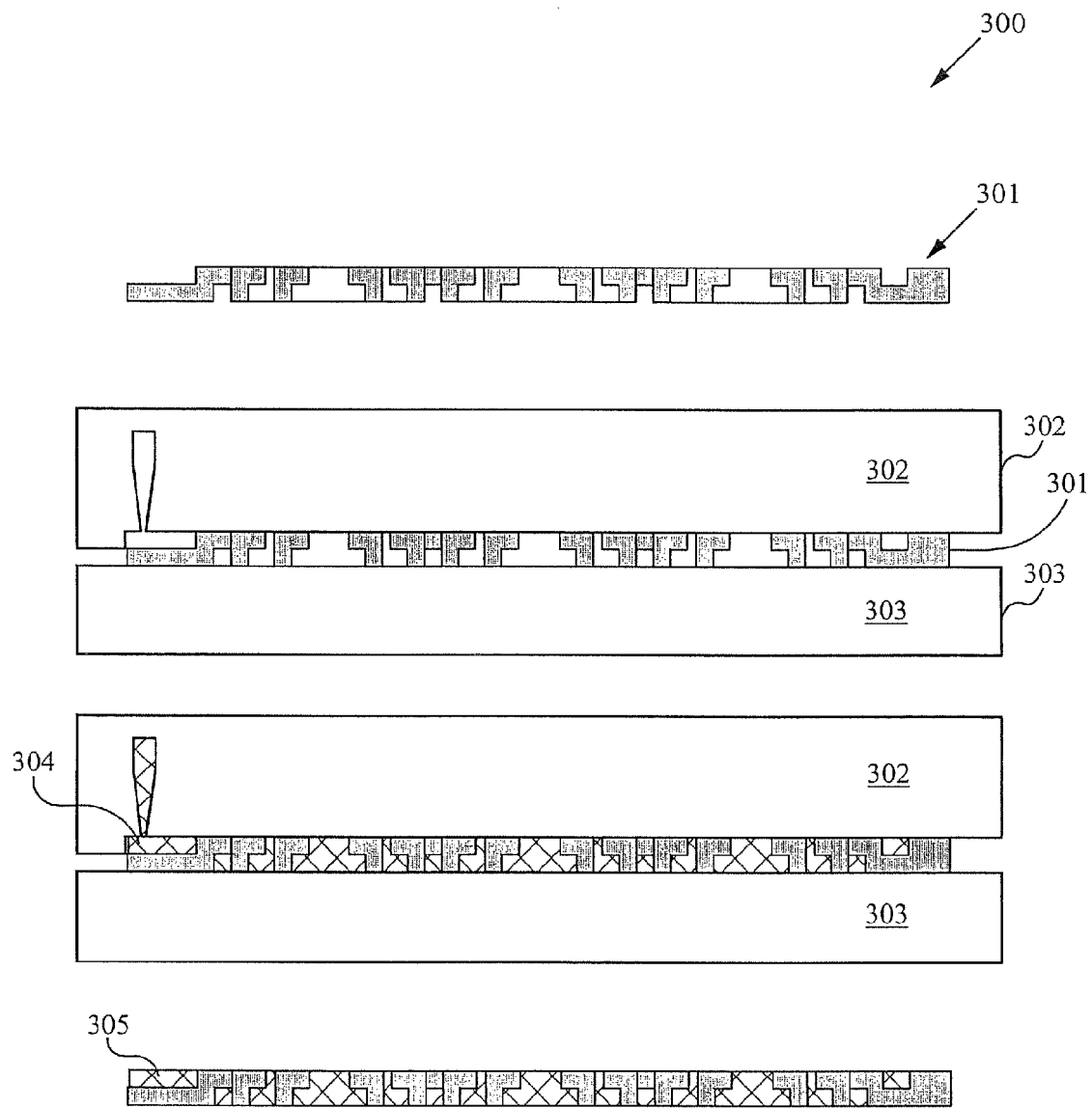
FIG. 3 shows a process of forming a molded leadframe according to an embodiment of the current invention.

In a first aspect of the invention, a process 300 of forming semiconductor packages is detailed in FIG. 3. A leadframe strip 301 is shown in cross section. In some embodiments, a top mold 302 and a bottom mold 303 are placed to effectuate the injection therein of a mold compound 304. The top and bottom molds 302, 303 can be metal, ceramic, or any material having an appropriate thermal characteristic to withstand the temperatures of the mold compound 304 in its liquid state. It is commonly known by those of ordinary skill in the art of semiconductor device manufacturing that a wide variety of mold compounds 304 are able to be used, each having advantages, disadvantages, and characteristics appropriate for a given application. By way of example, in high temperature applications such as microprocessors which generate a significant amount of heat, a high thermal conductivity mold compound 304 can be used. What is formed is a molded lead frame 305. Advantageously, the molded leadframe strip 305 will display enhanced rigidity and robust reliability characteristics. The use of a mold compound 304 further enhances encapsulation and protection from external moisture that standard PCB substrates such as polyimide or FR4 cannot provide.

Figure 4A:
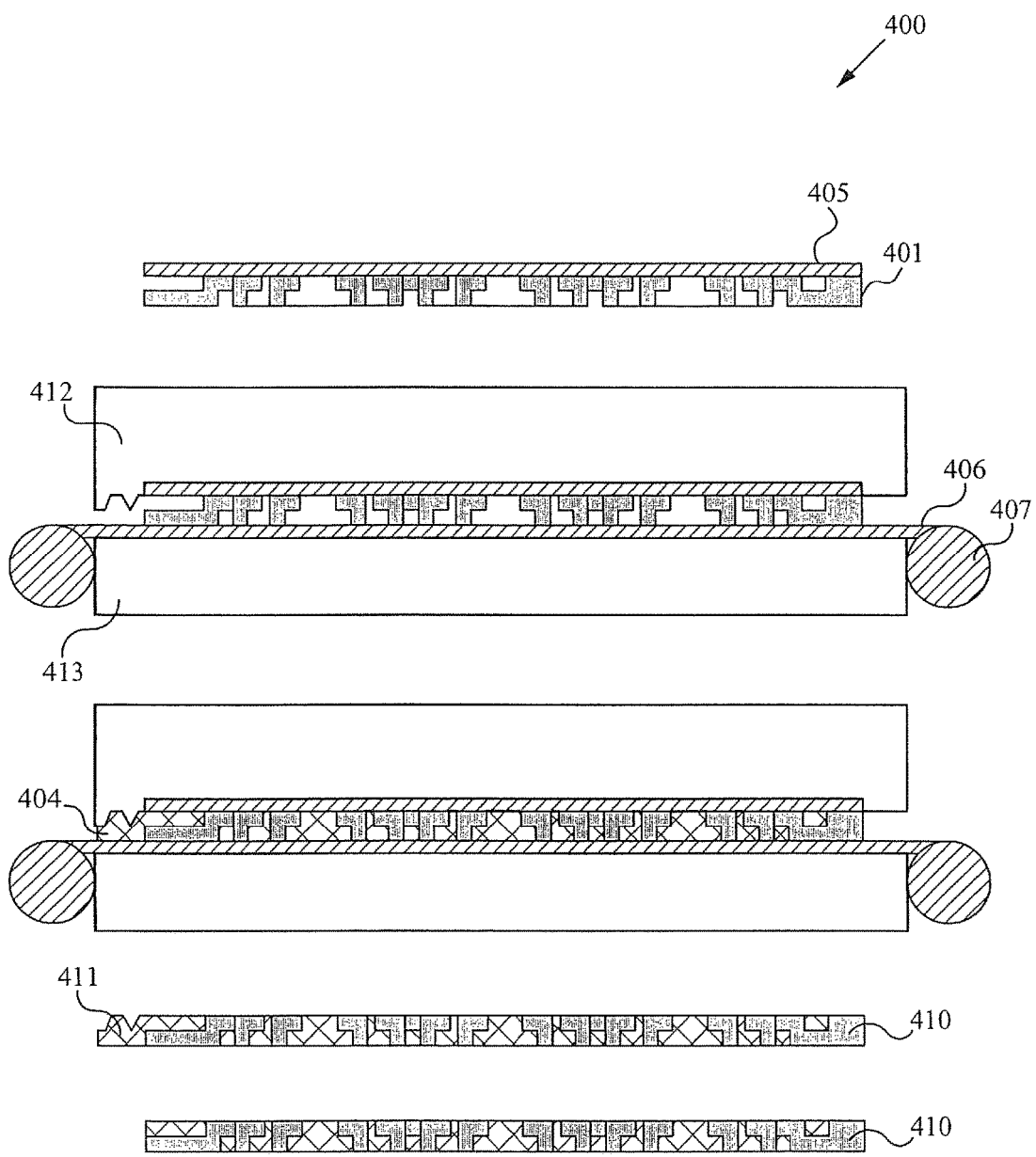
FIG. 4A shows a process of forming a molded leadframe according to an embodiment of the current invention.

For more predictable molding results, carrier tape can be used to effectuate the molding process as shown in FIG. 4A. A process 400 includes applying a tape 405 on its adhesive side to a leadframe strip 401. The leadframe strip 401 is then placed in a top mold 412 by the top surface of the leadframe 401. On the opposite side of the leadframe strip 401, non-adhesive tape 406 is prepared in a tape loader 407 at the bottom mold 413. Once the leadframe strip 401 is in place between a top mold 412 and a bottom mold 413, mold compound 404 is injected and substantially fills all empty cavities. When removed from the mold, a molded leadframe strip 410 is formed. Optionally, a de-gate/de-runner step removes excess mold compound 411.

Figure 4B:
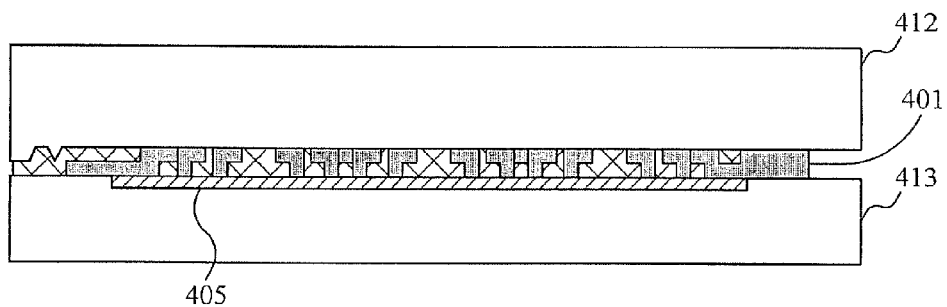
FIG. 4B shows a process of forming a molded leadframe according to another embodiment of the current invention.
Figure 4C:
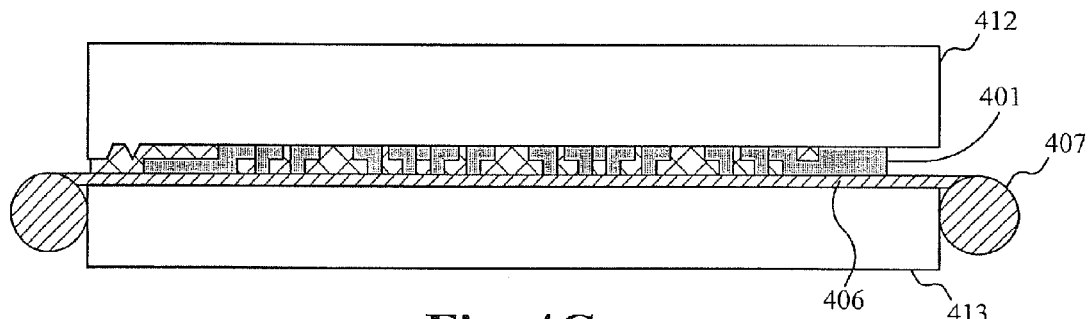
FIG. 4C shows a process of forming a molded leadframe according to yet another embodiment of the current invention.
Figure 4D:
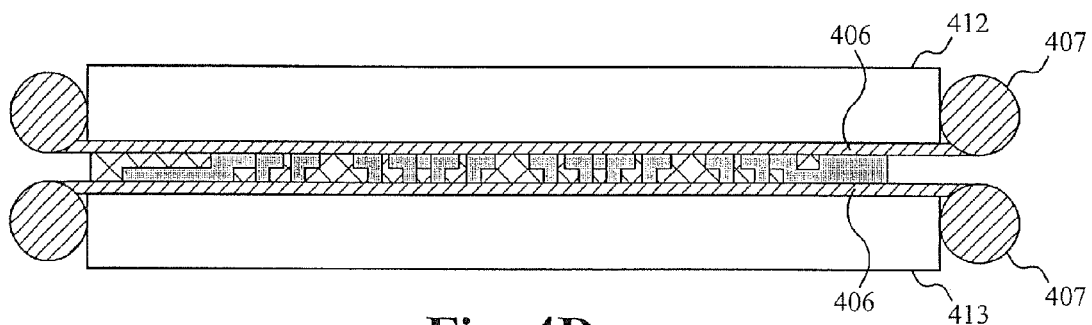
FIG. 4D shows a process of forming a molded leadframe according to yet another embodiment of the current invention.

FIGS. 4B, 4C and 4D show alternate embodiments for the process detailed in FIG. 4A. In some embodiments, the leadframe strip 401 can be placed between the top mold 412 and bottom mold 413 with adhesive tape 405 applied to the bottom as shown in FIG. 4B. FIG. 4C shows another embodiment wherein the leadframe strip 401 can be placed between the top mold 412 and bottom mold 413 without the use of adhesive tape. Non adhesive tape 406 can be provided by a tape loader 407 on the bottom surface of the leadframe strip 401. FIG. 4D shows yet another exemplary embodiment where two tape loaders 407 are provided to effectuate the molding of the leadframe strip 401. It will be appreciated by those of ordinary skill in the art of semiconductor manufacturing that several embodiments exist to place a leadframe strip 401 between a top mold 412 and a bottom mold 413 and the embodiments discussed herein are written solely to be exemplary and non limiting.

Figure 5:
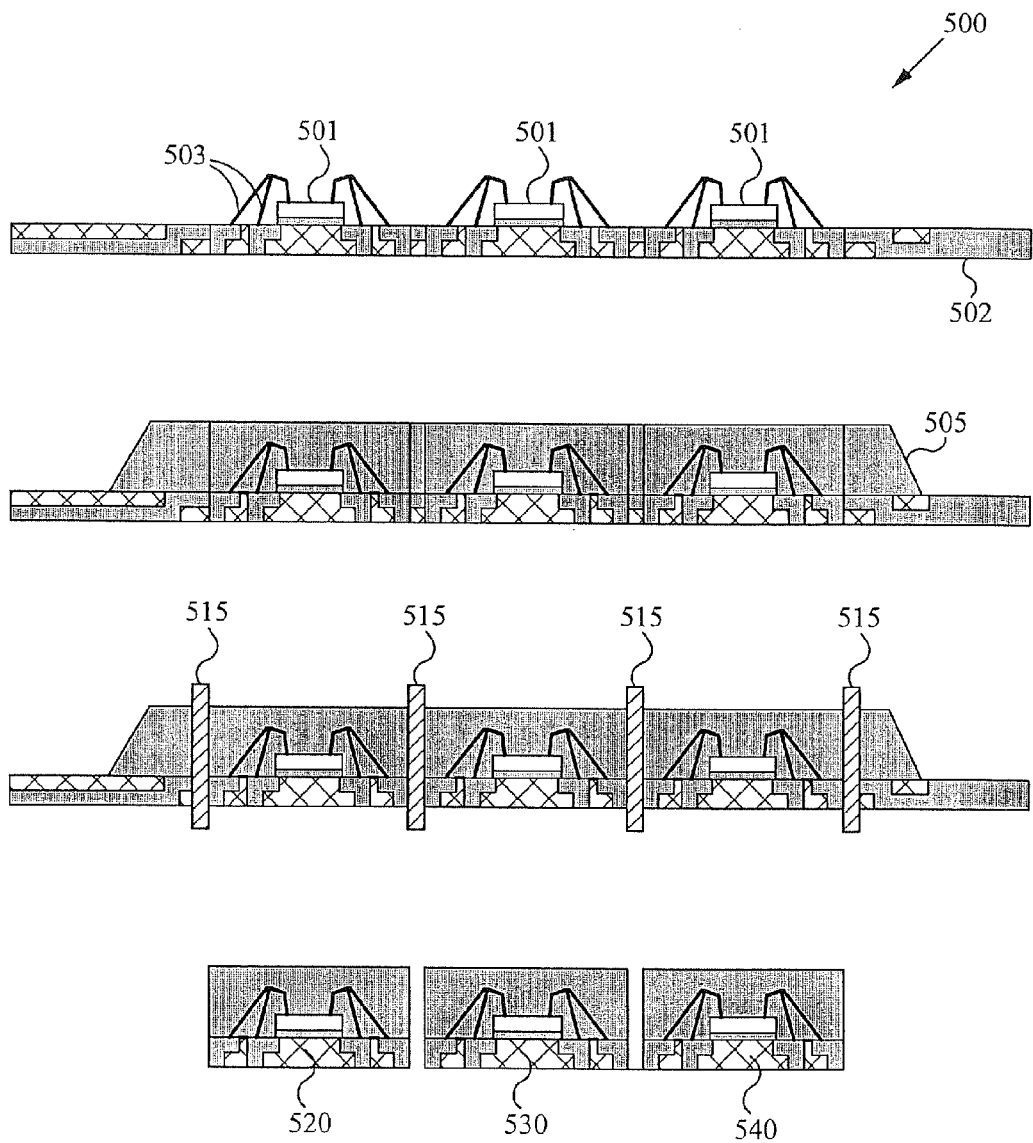
FIG. 5 shows a process of forming individual packages according to an embodiment of the current invention.

FIG. 5 shows a process 500 of completing the semiconductor packaging process. Semiconductor devices 501 are mounted on the molded leadframe strip 502. In some embodiments, multiple semiconductor devices 501 are mounted in each individual position on the molded leadframe strip 502. Such devices are known as multi chip modules (MCM). Bondwires 503 are mounted on the semiconductor devices 501 to effectuate electrical contact between the molded leadframe strip 502 and the semiconductor devices 501. In some embodiments where multiple semiconductor devices 501 are placed in each position, bondwires 503 can be placed to effectuate electrical contact between two or more semiconductor devices as applications require. Next, a second mold compound 505 is applied to the molded leadframe strip 502. The second mold 505 encases the semiconductor devices 501 and bondwires 503 to protect them from outer environments. In some embodiments, the second mold compound 505 and the first mold compound described in FIGS. 3 and 4 are the same material type. Alternatively, the first and second mold compound 505 are able to be different material types to meet the demands of particular applications. By way of example, the semiconductor device 501 and the leadframe 401 in FIG. 4 can have different coefficients of expansion in response to heat. The semiconductor device 501 and the leadframe 401 can have different mold compounds having different thermal characteristics such as thermal resistivity and thermal expansion to offset the differing coefficients. The molded leadframe strip 502 are then singulated such as by saw blades 515 to form singulated semiconductor packages 520, 530 and 540. The singulated devices 520, 530 and 540 are generally tested, subjected to stress, and tested again to ensure reliability and to filter out non passing or non standard units.

Figure 6A:
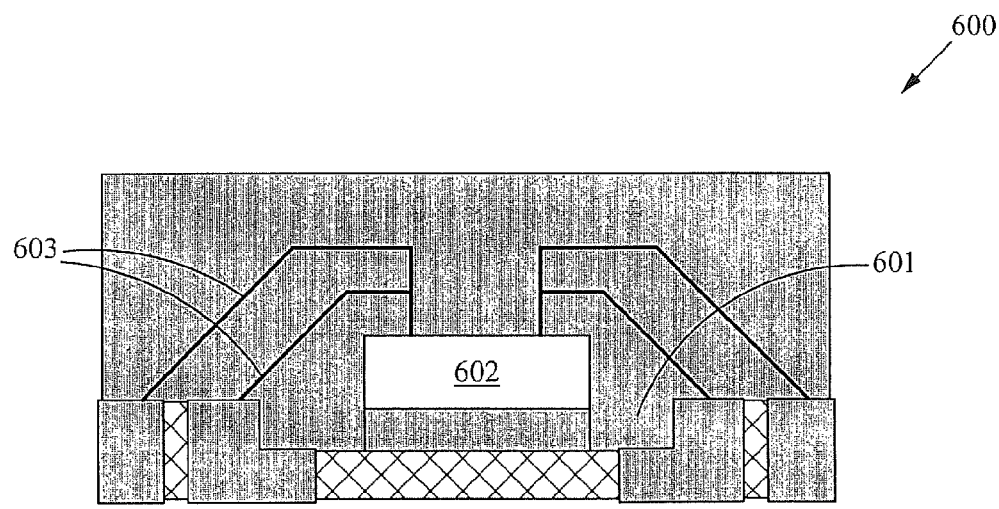
FIG. 6A shows a semiconductor package according to an embodiment of the current invention.
Figure 6B:
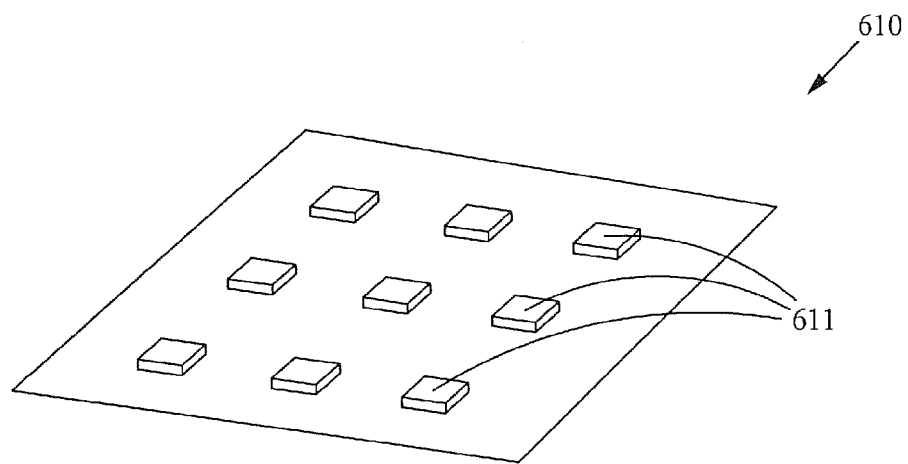
FIG. 6B shows an apparatus for realizing the package depicted in FIG. 6A according to an embodiment of the current invention.
Figure 6C:
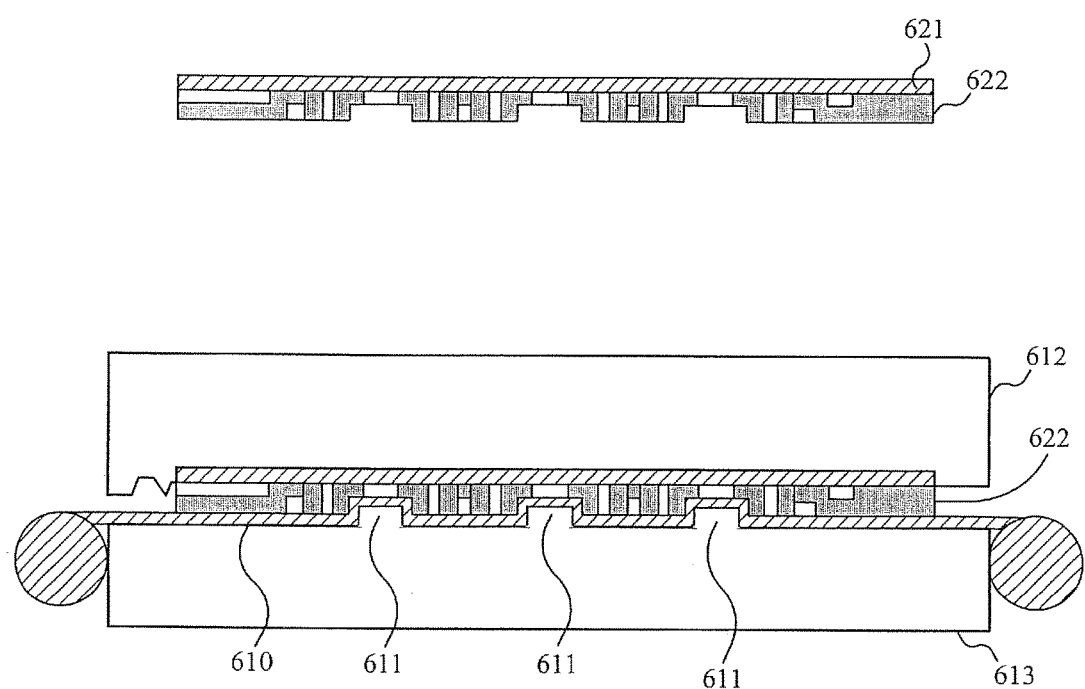
FIG. 6C shows an alternate process of forming a package in FIG. 6A according to an embodiment of the current invention.

In some applications, it is advantageous to allow for greater height clearance within the semiconductor package for example to accept thicker semiconductor devices. FIG. 6A shows a singulated semiconductor package 600 in cross section. Within the package, a step cavity or recessed area 601 is capable of receiving a thicker semiconductor die 602, larger bondwires 603 or in certain embodiments multiple stacked die. FIG. 6B shows an exemplary surface 610 of the mold 412 or 413 shown in FIG. 4B. Elevated protrusions 611 are placed to coincide with a leadframe strip to form the recessed area 601 into the molded leadframe. In an exemplary embodiment, adhesive tape 621 is applied to the back surface of the leadframe strip 622 as shown in FIG. 6C. The non adhesive tape 610 is embossed by the molded element 613 having the protrusions 611. The molded leadframe 622 will include step cavities corresponding to the protrusions 611.

Figure 6D:
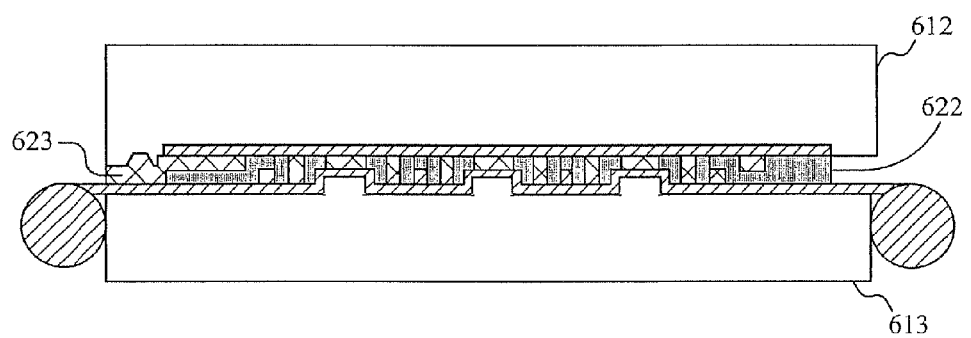
FIG. 6D shows the remainder of the process for forming the package FIG. 6A according to an embodiment of the current invention.
Figure 6D:
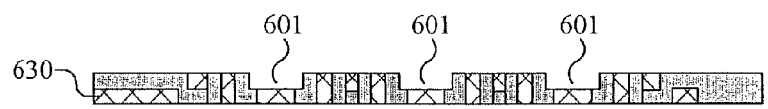
Figure 6D:
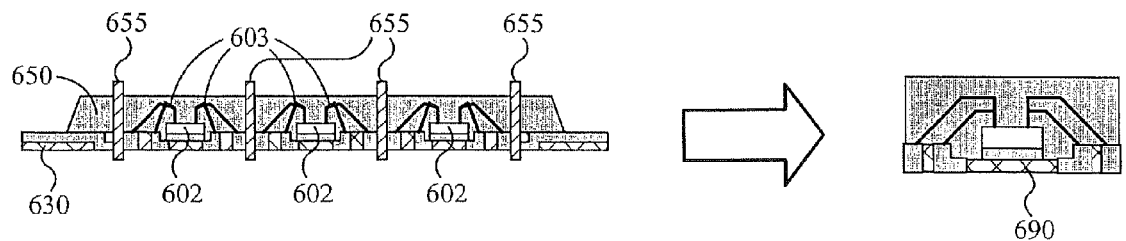

FIG. 6D shows the leadframe strip 622 with a first mold compound 623 to form a molded leadframe 630 having recessed areas 601. To form singulated packages, semiconductor devices 602 and bondwires 603 are affixed onto the molded leadframe 630. The devices 602, bondwires 603 and molded leadframe 630 are encased in a second mold compound 650. The second mold compound 650 and the first mold compound 623 are able to be the same compound or different compounds depending on the application. Saw blades 655 then singulate the molded leadframe strip 630 into individual semiconductor packages 690.

Figure 6E:
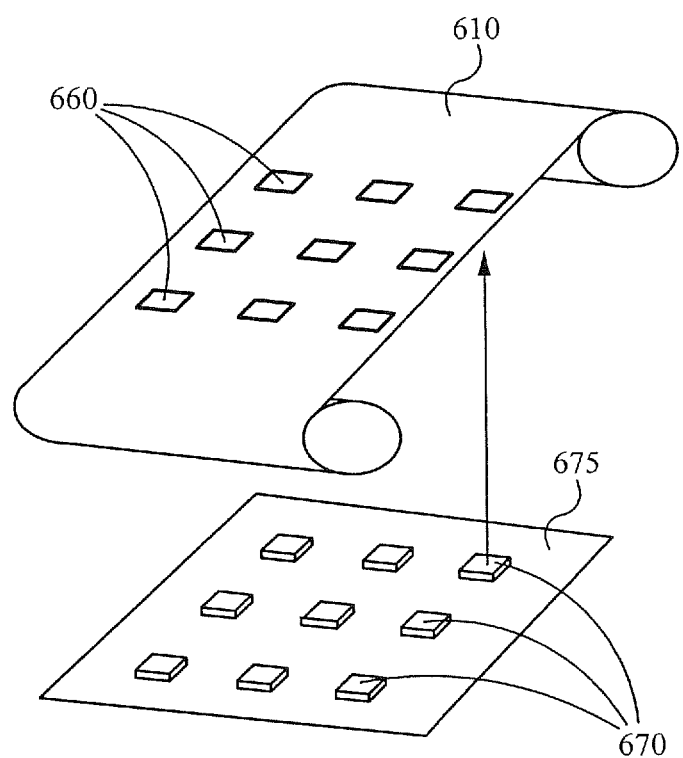
FIG. 6E shows an alternate apparatus of realizing the package depicted in FIG. 6A according to an embodiment of the current invention.

An alternative surface is shown in FIG. 6E. In certain applications, such as high temperature applications, thick leadframes are advantageous. To accommodate thick leadframes, the non adhesive tape 610 can have pre-formed holes 660 configured to receive protrusions 670 on a mold surface 675. The mold surface 675 can be the surface of the top mold 612 or the bottom bold 613. The mold can be formed of metal, ceramic, hard impact rubber, or any other suitable material.

Figure 7:
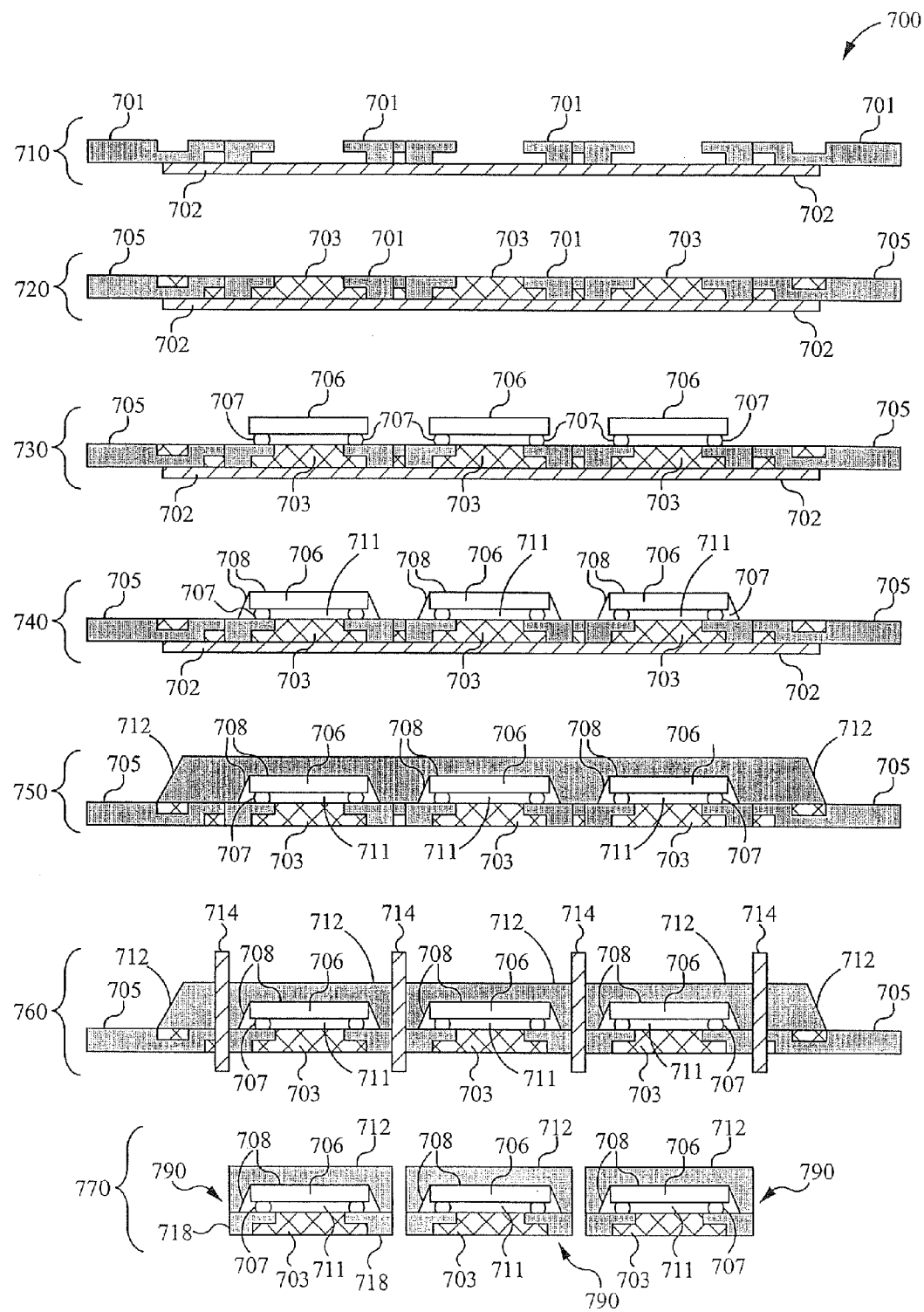
FIG. 7 shows a process of faulting a Flip Chip Cavity package according to an embodiment of the current invention.

FIG. 7 shows a process 700 for forming flip chip cavity packaged devices 790. At the step 710, a leadframe strip 701 is mounted to an adhesive tape 702. In some embodiments, the leadframe strip 701 is a half etched leadframe. At the step 720, the leadframe strip 701 is molded by a first mold compound 703 by any of the processes described relative to FIGS. 4 and 5. The lead frame strip 701 typically comprises copper, Alloy 42, or another suitable material, and has a typical thickness in the range of 127 to 500 micro meters. Optionally, the lead frame strip 701, or a portion of the lead frame strip 701 can be pre-plated to form a pre-plated leadframe (PPF). Such plating preferably can be appropriately selected to improve strength, bonding, electrical conductivity, and/or thermal transfer.

At the step 730, the flip chip semiconductor devices 706 are affixed onto the molded leadframe strip onto each individual position. In some embodiments, multiple devices 706 can be placed in each position as applications require. The flip chip devices 706 include conductive spheres 707 such as a solder ball affixed to effectuate electrical contact between the molded leadframe strip 705 and the devices 706. Alternatively, conductive cylinders (not shown) can be used instead of the conductive spheres 707. At the step 740, a liquid encapsulant 708 is dispensed to form a cavity 711 between the flip chip semiconductor devices 706 and the molded leadframe strip 705. Alternatively, a silicon coating can be used as the encapsulant 708 to form the cavity 711 between the flip chip semiconductor devices 706 and the molded leadframe strip 705. At the step 750, the molded leadframe strip 705, flip chip semiconductor devices 706 and conductive spheres 707 are encased in a second mold compound 712. The second mold compound 712 and the first mold compound 703 can be identical mold compounds or different mold compounds as applications require. The second mold compound 712 is preferably marked to facilitate alignment of a later singulation step. The adhesive tape 702 is removed. A post-mold plating process as practiced by a person of ordinary skill in the art can be performed on the molded leadframe 705. The post-mold plating process can be skipped if a pre-plated leadframe (PPF) is utilized for the leadframe strip 701.

At the step 760, the double molded leadframe strip 705 is singulated by saw blades 714. At the step 770, the singulated double molded leadframe strip 705 forms individual flip chip cavity packages 790. These individual devices can then be tested, marked and bulk packaged for shipping and assembly. It will be apparent to those of ordinary skill in the art of semiconductor device assembly that although few leads 718 are shown, a few to hundreds of leads are able to be realized using the process described herein. Flexibility in routing I/O is advantageous, since end users can have specific demands as to the locations of I/O on a package landing pattern. To that end, a second leadframe (not shown) can be used. The second leadframe can couple to the first leadframe by use of a soft metal. The soft metal can include the materials of gold, silver, lead and tin. The second leadframe can be used to route the I/O to any pattern required by an application, allowing great flexibility in footprints and landing patterns.

Figure 8:
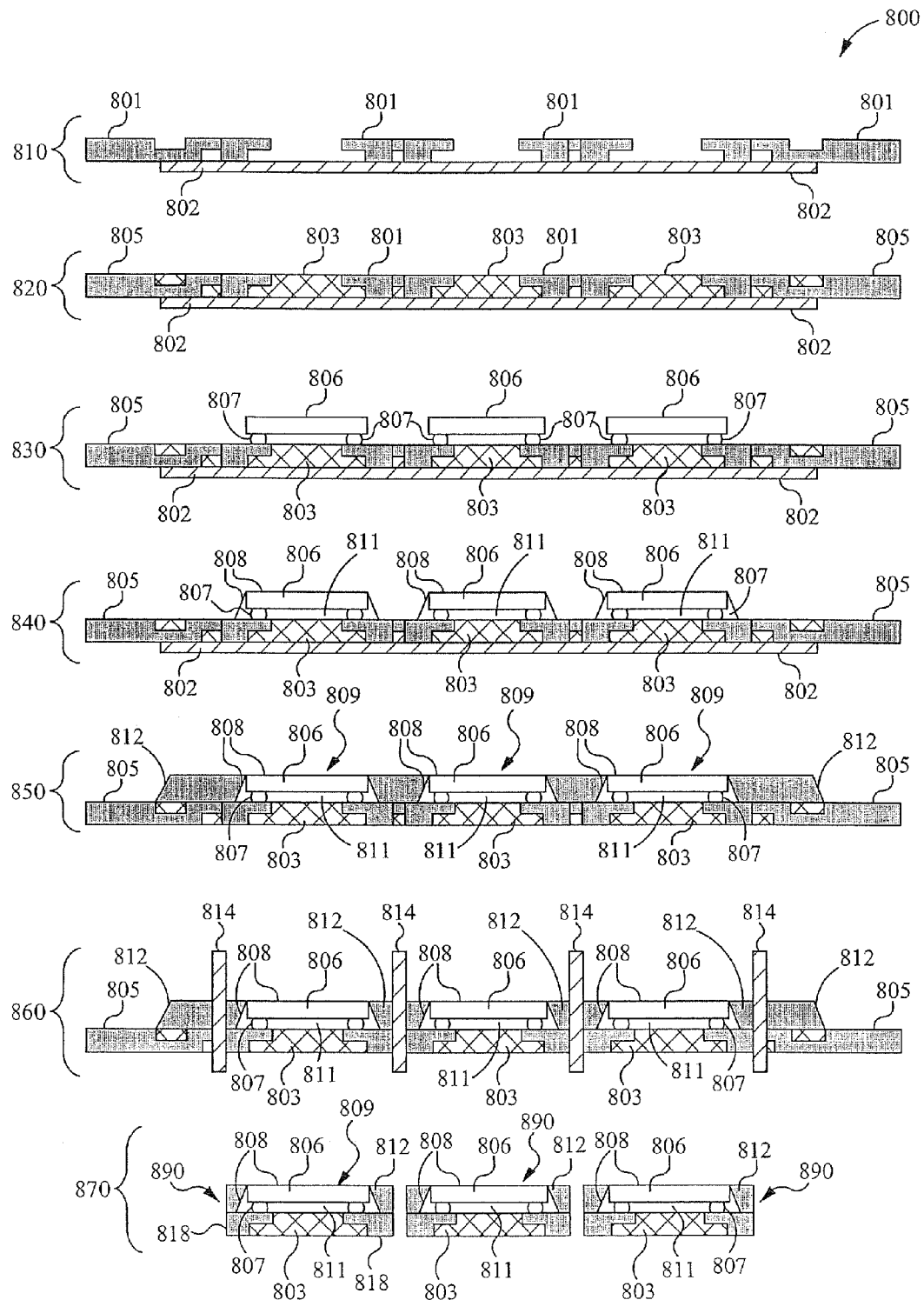
FIG. 8 shows a process of forming an alternative embodiment of a Flip Chip Cavity package according to an embodiment of the current invention.

In another aspect of the invention, FIG. 8 shows an alternative process 800 for forming flip chip cavity packaged devices 890. At the step 810, a leadframe strip 801 is mounted to an adhesive tape 802. In some embodiments, the leadframe strip 801 is a half etched leadframe. At the step 820, the leadframe strip 801 is molded by a first mold compound 803 by any of the processes described relative to FIGS. 4 and 5. The lead frame strip 801 typically comprises copper, Alloy 42, or another suitable material, and has a typical thickness in the range of 127 to 500 micro meters. Optionally, the lead frame strip 801, or a portion of the lead frame strip 801 can be pre-plated to form a pre-plated leadframe (PPF). Such plating preferably can be appropriately selected to improve strength, bonding, electrical conductivity, and/or thermal transfer.

At the step 830, the flip chip semiconductor devices 806 are affixed onto the molded leadframe strip onto each individual position. In some embodiments, multiple devices 806 can be placed in each position as applications require. The flip chip devices 806 include conductive spheres 807 such as a solder ball affixed to effectuate electrical contact between the molded leadframe strip 805 and the devices 806. Alternatively, conductive cylinders (not shown) can be used instead of the conductive spheres 807. At the step 840, a liquid encapsulant 808 is dispensed to form a cavity 811 between the flip chip semiconductor devices 806 and the molded leadframe strip 805. Alternatively, a silicon coating can be used as the encapsulant 808 to form the cavity 811 between the flip chip semiconductor devices 806 and the molded leadframe strip 805. At the step 850, the molded leadframe strip 805, flip chip semiconductor devices 806 and conductive spheres 807 are encased in a second mold compound 812. The second mold compound 812 is molded such that a top surface 809 of the flip chip semiconductor devices 806 are exposed. The second mold compound 812 and the first mold compound 803 can be identical mold compounds or different mold compounds as applications require. The second mold compound 812 is preferably marked to facilitate alignment of a later singulation step. The adhesive tape 802 is removed. A post-mold plating process as practiced by a person of ordinary skill in the art can be performed on the molded leadframe 805. The post-mold plating process can be skipped if a pre-plated leadframe (PPF) is utilized for the leadframe strip 801.

At the step 860, the double molded leadframe strip 805 is singulated by saw blades 814. At the step 870, the singulated double molded leadframe strip 805 forms individual flip chip cavity packages 890. These individual devices can then be tested, marked and bulk packaged for shipping and assembly. It will be apparent to those of ordinary skill in the art of semiconductor device assembly that although few leads 818 are shown, a few to hundreds of leads are able to be realized using the process described herein. Flexibility in routing I/O is advantageous, since end users can have specific demands as to the locations of I/O on a package landing pattern. To that end, a second leadframe (not shown) can be used. The second leadframe can couple to the first leadframe by use of a soft metal. The soft metal can include the materials of gold, silver, lead and tin. The second leadframe can be used to route the I/O to any pattern required by an application, allowing great flexibility in footprints and landing patterns.

Figure 9:
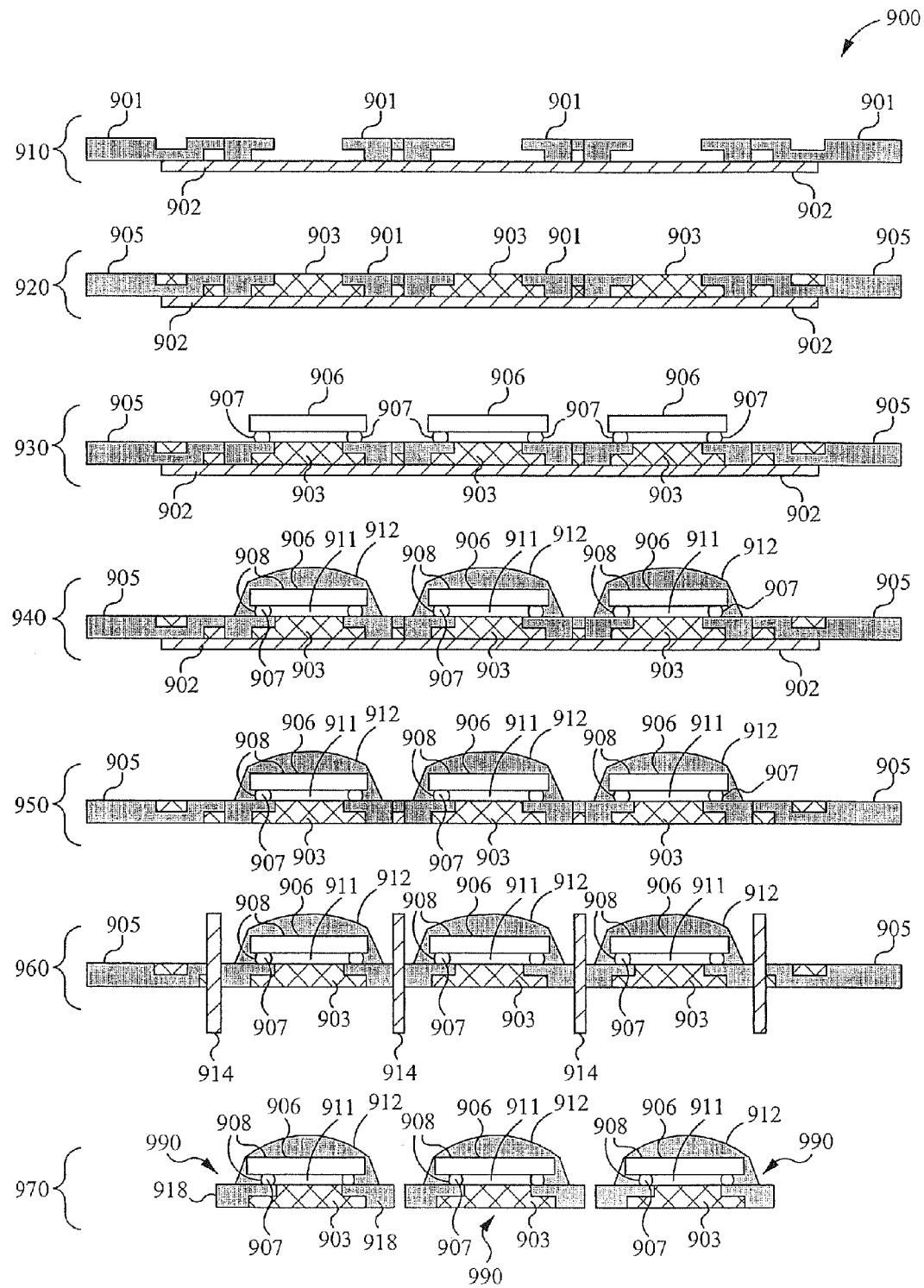
FIG. 9 shows a process of forming yet another embodiment of a Flip Chip Cavity package according to an embodiment of the current invention.

In another aspect of the invention, FIG. 9 shows yet another alternative process 900 for forming flip chip cavity packaged devices 990. At the step 910, a leadframe strip 901 is mounted to an adhesive tape 902. In some embodiments, the leadframe strip 901 is a half etched leadframe. At the step 920, the leadframe strip 901 is molded by a first mold compound 903 by any of the processes described relative to FIGS. 4 and 5. The lead frame strip 901 typically comprises copper, Alloy 42, or another suitable material, and has a typical thickness in the range of 127 to 500 micro meters. Optionally, the lead frame strip 901, or a portion of the lead frame strip 901 can be pre-plated to form a pre-plated leadframe (PPF). Such plating preferably can be appropriately selected to improve strength, bonding, electrical conductivity, and/or thermal transfer.

At the step 930, the flip chip semiconductor devices 906 are affixed onto the molded leadframe strip onto each individual position. In some embodiments, multiple devices 906 can be placed in each position as applications require. The flip chip devices 906 include conductive spheres 907 such as a solder ball affixed to effectuate electrical contact between the molded leadframe strip 905 and the devices 906. Alternatively, conductive cylinders (not shown) can be used instead of the conductive spheres 907. At the step 940, a liquid encapsulant 908 is dispensed to form a cavity 911 between the flip chip semiconductor devices 906 and the molded leadframe strip 905. Alternatively, a silicon coating can be used as the encapsulant 908 to form the cavity 911 between the flip chip semiconductor devices 906 and the molded leadframe strip 905. The molded leadframe strip 905, flip chip semiconductor devices 906 and conductive spheres 907 are encased in a second mold compound or globular form 912. The second mold compound 912 is dispensed and molded to produce the globular form 912 encasing the molded leadframe strip 905, flip chip semiconductor devices 906 and conductive spheres 907. The second mold compound 912 and the first mold compound 903 can be identical mold compounds or different mold compounds as applications require. At the step 950, the second mold compound 912 and the molded leadframe strip 905 are preferably marked to facilitate alignment of a later singulation step. The adhesive tape 902 is removed. A post-mold plating process as practiced by a person of ordinary skill in the art can be performed on the molded leadframe 905. The post-mold plating process can be skipped if a pre-plated leadframe (PPF) is utilized for the leadframe strip 901.

At the step 960, the double molded leadframe strip 905 is singulated by saw blades 914. At the step 970, the singulated double molded leadframe strip 905 forms individual flip chip cavity packages 990. These individual devices can then be tested, marked and bulk packaged for shipping and assembly. It will be apparent to those of ordinary skill in the art of semiconductor device assembly that although few leads 918 are shown, a few to hundreds of leads are able to be realized using the process described herein. Flexibility in routing I/O is advantageous, since end users can have specific demands as to the locations of I/O on a package landing pattern. To that end, a second leadframe (not shown) can be used. The second leadframe can couple to the first leadframe by use of a soft metal. The soft metal can include the materials of gold, silver, lead and tin. The second leadframe can be used to route the I/O to any pattern required by an application, allowing great flexibility in footprints and landing patterns.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A process for forming a semiconductor package comprising:
   a. forming a leadframe strip having a first cavity formed on a first face opening to a second cavity formed on a second face;
   b. at least partially encasing the leadframe strip in a first mold compound thereby forming a molded leadframe strip with external surfaces of the first mold compound and the leadframe strip substantially coplanar;
   c. mounting at least one flip chip semiconductor device on the molded leadframe strip with the at least one flip chip semiconductor device positioned, in cross section, over only one contiguous cavity, a combination of the first cavity on the first face of the leadframe strip and the second cavity on the second face, the at least one flip chip semiconductor device having conductive masses attached thereon to effectuate electrical contact between the at least one flip chip semiconductor device and the molded leadframe strip;
   d. dispensing liquid encapsulant on the at least one flip chip semiconductor device to form a third cavity unfilled with any solid compound between the at least one flip chip semiconductor device and the molded leadframe strip in cross section;
   e. at least partially encasing the molded leadframe strip, the at least one flip chip semiconductor device, and the conductive masses in a second mold compound, wherein the second mold compound is molded such that a top surface of the flip chip semiconductor device is substantially exposed and uncovered by the second mold compound in cross section and the entire sides of the flip chip semiconductor device are encased by the liquid encapsulant in cross section; and
   f. singulating the molded leadframe strip to form discrete semiconductor packages.

2. The process in claim 1, wherein the second mold compound is dispensed to produce a globular form on the at least one flip chip semiconductor device to form the cavity between the at least one flip chip semiconductor device and the at least one molded leadframe.

3. The process in claim 1, wherein the conductive masses are formed in a shape of one of substantially spherical or substantially cylindrical.

4. The process in claim 1, further comprising embossing at least one step cavity having contact precipices into the molded leadframe strip for receiving the at least one flip chip semiconductor device.

5. The process of claim 1, wherein the first and second mold compounds comprise the same material.

6. The process of claim 1, wherein the first and second mold compounds comprise differing material.

7. The process in claim 1, wherein the conductive masses are formed in a shape that is substantially cylindrical.

8. The process in claim 1, wherein the process further comprises mounting a first surface of the first leadframe strip on an adhesive side of an adhesive tape and mounting a second surface of the first leadframe strip to a non-adhesive tape.

9. The process of claim 8, wherein the process further comprises removing the adhesive tape and the non-adhesive tape from the molded leadframe strip.

10. The process of claim 1, wherein the process further comprises mounting a first surface of the first leadframe strip on a first non-adhesive tape and mounting a second surface of the first leadframe strip to a second non-adhesive tape.

11. A process for forming a semiconductor package comprising:
   a. forming a leadframe strip having a first cavity formed on a first face opening to a second cavity formed on a second face;
   b. at least partially encasing the leadframe strip in a first mold compound thereby forming a molded leadframe strip with external surfaces of the first mold compound and the leadframe strip substantially coplanar;
   c. mounting at least one flip chip semiconductor device on the molded leadframe strip with the at least one flip chip semiconductor device positioned, in cross section, over only one contiguous cavity, a combination of the first cavity on the first face of the leadframe strip and the second cavity on the second face, the at least one flip chip semiconductor device having conductive masses attached thereon to effectuate electrical contact between the at least one flip chip semiconductor device and the molded leadframe strip;
   d. at least partially encasing the molded leadframe strip, the at least one flip chip semiconductor device, and the conductive masses in a second mold compound forming a third cavity between the at least one flip chip semiconductor device and the molded leadframe strip, wherein in cross section containing the conductive masses the third cavity is unfilled with any solid compound within the third cavity, wherein the entire sides of the flip chip semiconductor device are encased by the second mold compound in cross section; and
   e. singulating the molded leadframe strip to form discrete semiconductor packages.

12. A process for forming a semiconductor package comprising:
   a. forming a leadframe strip having a first cavity formed on a first face opening to a second cavity formed on a second face;
   b. at least partially encasing the leadframe strip in a first mold compound thereby forming a molded leadframe strip with external surfaces of the first mold compound and the leadframe strip substantially coplanar;
   c. mounting at least one flip chip semiconductor device on the molded leadframe strip, the at least one flip chip semiconductor device having conductive masses attached thereon to effectuate electrical contact between the at least one flip chip semiconductor device and the molded leadframe strip;
   d. at least partially encasing the molded leadframe strip, the at least one flip chip semiconductor device, and the conductive masses in a second mold compound, forming a third cavity between the at least one flip chip semiconductor device and the molded leadframe strip, wherein in cross section containing the plurality of conductive masses the third cavity is unfilled with any solid compound within the third cavity; and
   e. singulating the molded leadframe strip to form discrete semiconductor packages.

13. The process in claim 12, wherein the second mold compound is dispensed to produce a globular form on the at least one flip chip semiconductor device to form the third cavity between the at least one flip chip semiconductor device and the at least one molded leadframe.

14. The process in claim 12, further comprising embossing at least one step cavity having contact precipices into the molded leadframe strip for receiving the at least one flip chip semiconductor device.

15. The process of claim 12, wherein the first and second mold compounds comprise the same material.

16. The process of claim 12, wherein the first and second mold compounds comprise differing material.

17. The process in claim 12, wherein the conductive masses are formed in a shape of one of substantially spherical or substantially cylindrical.

18. The process in claim 12, wherein the process further comprises mounting a first surface of the first leadframe strip on an adhesive side of an adhesive tape and mounting a second surface of the first leadframe strip to a non-adhesive tape.

19. The process of claim 18, wherein the process further comprises removing the adhesive tape and the non-adhesive tape from the molded leadframe strip.

20. The process of claim 12, wherein the process further comprises mounting a first surface of the first leadframe strip on a first non-adhesive tape and mounting a second surface of the first leadframe strip to a second non-adhesive tape.

* * * * *